(12) United States Patent
Newell (10) Patent No.: US 7,659,841 B1
(45) Date of Patent: Feb. 9, 2010

(54) QUADRATIC AND CUBIC COMPENSATION OF SIGMA-DELTA D/A AND A/D CONVERTERS

(75) Inventor: G. Richard Newell, Walnut Creek, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/187,541

(22) Filed: Aug. 7, 2008

(51) Int. Cl.
*H03M 1/10* (2006.01)
(52) U.S. Cl. ............ 341/120; 341/143; 341/144; 341/155
(58) Field of Classification Search ............ 341/120, 341/143
See application file for complete search history.

(56) References Cited

U.S. PATENT DOCUMENTS

| | | | |
|---|---|---|---|
| 4,943,807 | A | 7/1990 | Early et al. |
| 5,087,914 | A | 2/1992 | Sooch et al. |
| 5,257,026 | A | 10/1993 | Thompson et al. |
| 5,594,612 | A | 1/1997 | Henrion |
| 6,191,715 | B1 * | 2/2001 | Fowers .................. 341/120 |
| 7,230,556 | B2 | 6/2007 | Rivoir |
| 7,245,246 | B2 * | 7/2007 | Ihs et al. ................ 341/143 |

OTHER PUBLICATIONS

Cataltepe, T., Kramer, A.R., Larson, L.E., Temes, G.C., Walden, R. H., "Digitally Corrected Multi-Bit ΣΔ Data Converters," in Oversamping Delta-Sigma Data Converters, edited by J. Candy and G. Temes, pp. 192-195, IEEE Press 1992, originally printed in IEEE Proc. ISCAS'89, May 1989, pp. 647-650, New York, NY, USA.
Larson, L.E., "Multibit Oversampled Σ-Δ A/D Convertor with Digital Error Correction", in Oversampling Delta-Sigma Data Converters, edited by J. Candy and G. Temes, pp. 227-228, IEEE Press 1992, originally printed in Electron. Lett., Aug. 1988, vol. 24, pp. 1051-1052, New York, NY, USA.

* cited by examiner

*Primary Examiner*—Khai M Nguyen
(74) *Attorney, Agent, or Firm*—Lewis and Roca LLP (57) ABSTRACT

A circuit and method for compensating sigma-delta modulators in A/D and D/A converters is disclosed. Circuits according to the invention use a low-resolution Sigma-Delta encoded version of the signal to inexpensively encode quadratic and cubic compensation terms. These circuits can encode quadratic and cubic compensation signals with acceptably low quantization noise without requiring the use of expensive multi-bit multipliers to compute the square or cube of the signal. The method includes providing a binary word Q or a binary word C (or both) representing the desired amount of quadratic or cubic compensation to apply. Because the encoded quadratic and cubic signals have only one or a few bits, they can be multiplied by Q and C without the use of expensive multi-bit multipliers and applied to the modulator input or output to provide a compensated result.

26 Claims, 7 Drawing Sheets

QUADRATIC AND CUBIC COMPENSATION OF SIGMA-DELTA D/A AND A/D CONVERTERS

BACKGROUND OF THE INVENTION

1. Field of the Invention

The present invention relates to Sigma-Delta Digital-to-Analog (D/A) and Analog-to-Digital (A/D) converters. More particularly, the present invention relates to low-cost methods to compensate for quadratic and cubic errors in Sigma-Delta D/A and A/D converters.

2. The Prior Art

The Sigma-Delta modulator forms the basis for many modern Analog-to-Digital (A/D) and Digital-to-Analog (D/A) converter topologies. In one fairly common implementation of a D/A converter, a digital Sigma-Delta modulator takes in a relatively high-resolution but highly over-sampled digital input signal and converts it to a one-bit highly over-sampled digital output signal. The pulse density, or duty factor, of the one-bit output represents the signal. This one-bit signal is fed to a one-bit D/A converter which, by virtue of its simplicity, is generally lower in cost than a higher-resolution D/A converter.

Because the resolution of the digital signal is drastically lowered by the sigma-delta modulator, a large amount of quantization noise is added to the signal. However, due to the well-known frequency-shaping operation of the sigma-delta modulator, the quantization noise is added largely in frequency bands not occupied by the desired signal, and can thus be filtered away, leaving just the desired analog signal at the output of the converter.

The performance of the Sigma-Delta converter can be similar to that of a much higher resolution conventional converter. For example, a Sigma-Delta D/A converter comprising a one-bit modulator and a one-bit D/A and an output filter can have similar performance in many respects to a 16-bit conventional (e.g., R-2R ladder) D/A converter.

In a one-bit Sigma-Delta A/D converter, the Sigma-Delta modulator is mostly analog. An analog-input comparator and a one-bit D/A converter in the feedback loop of the modulator provide the interface between the analog and digital domains.

Practical Sigma-Delta D/A and A/D converters may exhibit Integral Non-Linearity (INL) errors for many reasons. One such reason includes errors due to Inter-Symbol Interference (ISI). This occurs where like digital symbols do not have a like effect in the analog domain because symbols are not completely independent of each other, and are influenced by the history of other recent symbols. For example, the DC result of converting the one-bit sequence of digital symbols "010010" to analog may be slightly different than the result from the sequence "001100," even though the average pulse density for the two sequences is the same, because in one case the two "1" bits are back-to-back and in the other case they are not. Often, this difference will exhibit itself primarily as a second-order (or quadratic) non-linearity of the D/A (or A/D) output.

Besides ISI, there are many other possible root-causes of INL including, for example, inherent component effects, such as the resistance sensitivity to an applied voltage of a resistor. When a sine wave is applied to a converter with INL, harmonic distortion products result.

Figure 1:
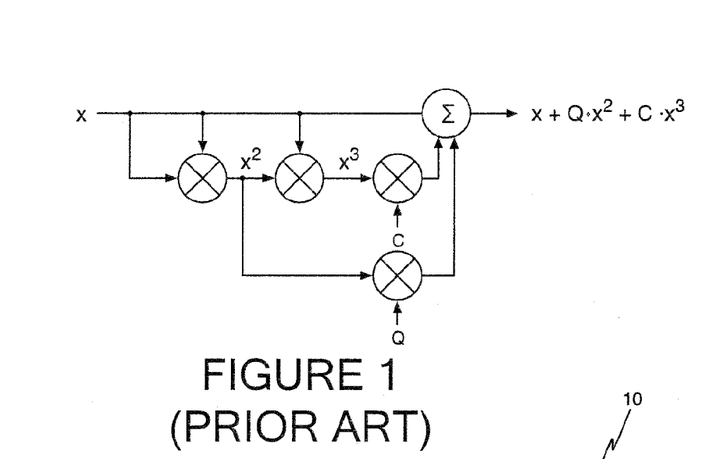
FIG. 1 is a diagram showing an illustrative prior-art compensation scheme.

Previous designs to compensate quadratic or cubic non-linearities generally required the use of multipliers either in the analog or digital domain. For instance, the input number to a Sigma-Delta D/A converter might be multiplied by itself (i.e., squared) and then multiplied by a compensation coefficient, and then added to the original input, in order to pre-compensate a non-linearity that occurs in the analog portion of the D/A converter (e.g., due to ISI). In this case, two multiply operations were required. Generally for a cubic compensation, three multipliers would be required, and for simultaneous quadratic and cubic compensation, a total of four multipliers would be used. Such an arrangement is shown in FIG. 1. Multipliers, whether implemented in the analog or digital domain, are relatively expensive components.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The present invention compensates small quadratic (2nd-order) or cubic (3rd-order) non-linearities of Sigma-Delta A/D and D/A converters as may be caused by ISI, component non-linearities, or any other source. This compensation of INL will generally work to reduce harmonic distortion as well.

The present invention uses a low-resolution Sigma-Delta encoded version of the signal to very inexpensively encode quadratic and cubic compensation terms. In one case, only a one-bit by one-bit multiply (a single XOR gate), and an additional adder input, is needed to provide a useful compensation function. Several different encodings are shown to work. Some combinations of encodings allow two compensation terms with non-overlapping duty-factors to be "added" using simple OR gates. Circuits designed in accordance with the present invention can encode quadratic and cubic compensation signals with low quantization noise. The present invention may employ a simple encoder and is compatible with simple (i.e., multiplierless) decoding, as discussed in more detail below. Digital Flash or other non-volatile memory is used to store information for compensating high-order analog errors in A/D converters or D/A converters.

Figure 2:
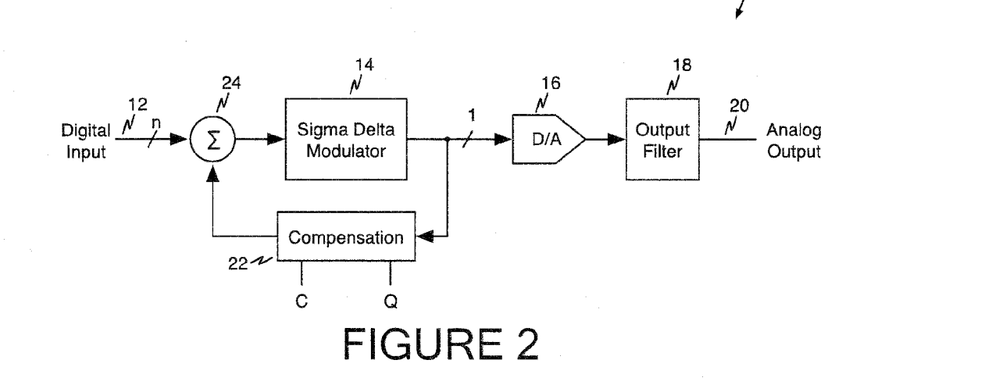
FIG. 2 is a block diagram of a circuit that may be used to implement the present invention in a digital-to-analog converter.

Referring now to FIG. 2, a block diagram shows a D/A converter system 10 in accordance with an illustrative embodiment of the present invention. System 10 receives a digital signal on lines 12. System 10 employs a sigma-delta modulator 14 driving D/A converter 16. The output of D/A converter 16 is supplied to filter 18 and then to analog output line 20.

The output of sigma-delta modulator 14 is provided to compensation circuit 22. A multi-bit quadratic compensation value Q is also provided to compensation circuit 22 as is a multi-bit cubic compensation value C. The output of compensation circuit 22 is provided to adder 24 to add the compensation value to the input signal prior to being provided to sigma-delta modulator 14. Persons of ordinary skill in the art will appreciate that the terms "quadratic" and "cubic" are approximate functions and need not be exact. The quadratic compensation applied by Q, and the cubic compensation applied by C are not required to be strictly the square or cube function of the modulator input in order to be useful. It is sufficient that the quadratic function exhibit a large second-order relationship, but it may also have large zero-order and first-order terms, and may even contain some power in higher-order terms, especially the even harmonics. Likewise, the cubic function may also contain large zero-order and first-order components in addition to its dominant third-order content, but may include some power in the second-order term, as well as higher-order terms, especially the odd harmonics. As long as the higher-order harmonics contained in the encoded functions are not large compared to the terms being compensated, some linear combination of the terms being utilized (e.g., offset, gain, quadratic, and cubic) should be possible to minimize those harmonics (e.g., the zero, first, second, and third harmonics) without introducing excessive higher-order harmonics (e.g., fourth and above) in the process.

Figure 3:
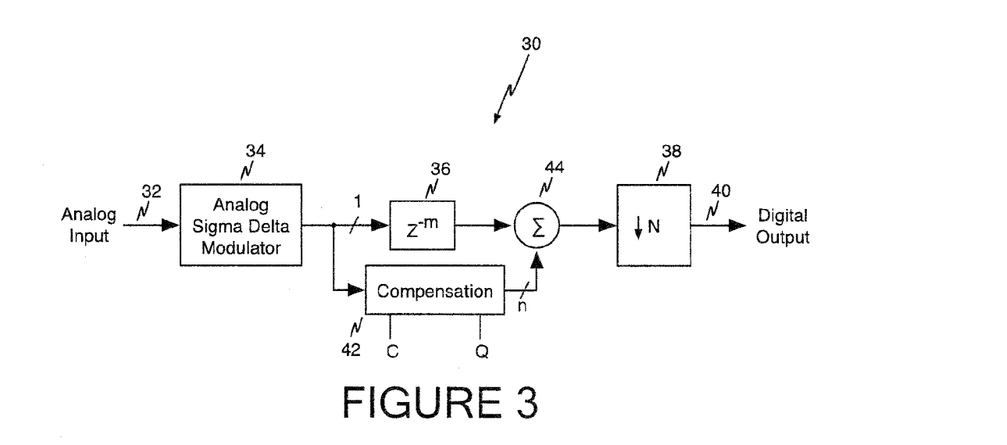
FIG. 3 is a block diagram of a circuit that may be used to implement the present invention in an analog-to-digital converter.

Referring now to FIG. 3, a block diagram shows an A/D converter system 30 in accordance with an illustrative embodiment of the present invention. System 30 takes an analog signal on line 32. System 30 employs an analog sigma-delta modulator 34 with a one-bit digital output driving delay line 36. The output of delay line 36 is supplied to adder 44, followed by filter 38 and then digital output lines 40.

The output of analog sigma-delta modulator 34 is provided to compensation circuit 42. A multi-bit quadratic compensation value Q is also provided to compensation circuit 42 as is a multi-bit cubic compensation value C. The output of compensation circuit 42 is provided to adder 44 to add the compensation value to the output signal from analog sigma-delta modulator 34 (after the modulator output signal has been delayed by delay line 36). The compensated signal is then provided to decimation filter 38. The optional delay line helps improve the matching of the phase of the compensation signal relative to the main output signal, for improved cancellation. The optional decimation filter is common in sigma-delta A/D converters in order to reduce the sample rate and thus the computational requirements for subsequent processing.

In accordance with the present invention, a low-resolution signal which approximates a quadratic function of the modulator input (or output in the case of an A/D converter) is encoded from the output of the Sigma-Delta modulator. In the case of a one-bit (i.e., two output-level) modulator, this may be done by examining the current output bit and the previous bit. There are four combinations of these two bits. The occurrence of the same bit twice in a row (i.e., "00" or "11") occurs more often at the extremes of modulator operational range, and the other two combinations (i.e., "01" or "10") occur more frequently when the modulator is near 50% duty factor, near the middle of its operational range. (The convention chosen here is that the most recent bit is shown as the most-significant bit (msb), followed by progressively older bits; although most of the functions shown herein are symmetrical and the order of bits doesn't matter.)

A flip-flop used to store the output bit for one clock cycle, and an XOR gate that has its inputs connected to the current output bit and the immediately previous output bit is used to encode the desired low-resolution signal (having a value of "1" when the last two modulator outputs were "01" or "10", otherwise "0"). This one-bit signal has an average duty factor that closely approximates a quadratic function of the modulator input. The signal is roughly proportional to the negative of the square of the Sigma-Delta modulator input (assuming a bi-polar design with 50% duty factor representing "zero"), plus an offset. Alternatively, an XNOR gate can used, providing a change in sign and the offset of the resulting quadratic function. Either encoding exhibits the essential second-order relationship between the duty factor of the encoded bit versus the input to the modulator.

In an embodiment of the present invention, no high-resolution multipliers are required. Where multipliers are used, at least one multiplicand has just one or at most a few bit(s); and such circuits are much less expensive than typical multi-bit (or analog) multipliers. An N-bit two's complement binary word can be multiplied by a single binary bit using a bank of N AND gates, as opposed to using an N×M multi-bit multiplier which would generally require many more gates.

By "ANDing" (multiplying) the one-bit signal having a duty factor that is quadratic versus the modulator input with a binary word "Q" that represents the desired amount of quadratic compensation, the value "Q" is, in effect, being multiplied by different values in different parts of the modulator range by the duty-factor of the encoded quadratic compensation bit. Adding the resultant number (which is either zero or Q for any given time sample) to the modulator input, the DC transfer function of the modulator can be intentionally bowed a small amount in one direction in order to (pre-) compensate a distortion in the other direction that occurs in another part of the signal chain, for example distortion due to ISI in the analog one-bit D/A circuit. In this way the overall D/A converter INL can be improved. A logic truth table (in Gray-code sequence) that represents this operation is shown in TABLE 1:

TABLE 1

| msb (current) | lsb (previous) | compensation |
|---|---|---|
| 0 | 0 | 0 |
| 0 | 1 | Q |
| 1 | 1 | 0 |
| 1 | 0 | Q |

An offset proportional to the amount of quadratic compensation applied is also introduced, but this can easily be compensated by subtracting a constant amount from the modulator input. It is common in the prior art to compensate offset and gain of the system, and the small offset introduced as part of the quadratic compensation can simply be absorbed into the existing offset correction. A smaller offset is introduced at the 50% duty factor mid-point of the modulator scale if the inverted "XNOR" encoding is used instead of the "XOR"

encoding as shown in TABLE 1. That is, if compensation value Q is added for cases "00" and "11" and zero is added for the "01" and "10" cases.

The XOR gate is performing a multiplication operation on the two most recent modulator outputs, and generates a signal having a duty factor that is roughly proportional to the square of the modulator input. This will become clearer if the modulator "high" level is considered to be +1 and the "low" level is considered to be −1. A truth table representing multiplication of the last two modulator bits, and applying compensation "Q" with this encoding, is shown in TABLE 2:

TABLE 2

| msb (current) | lsb (previous) | product/ compensation |
|---|---|---|
| −1 | −1 | +Q |
| −1 | +1 | −Q |
| +1 | +1 | +Q |
| +1 | −1 | −Q |

The similarity between TABLE 2 and TABLE 1 should be apparent. Persons skilled in the art will note that the rows with result "0" in TABLE 1 are (anti-) correlated with the rows with result "Q" since the total duty factor equals 100%. Therefore, the encoding schemes shown in TABLE 1 and TABLE 2 accomplish the same result, except for a multiplicative factor of −2, and a different offset over the working range. The essential similarity between TABLE 2 and TABLE 1 is that the average net compensation has a quadratic term relative to the modulator input value. Any difference in an average offset across the modulator range is of less importance, as it can be easily compensated, as has been shown. Any differences in the multiplicative factor can be absorbed into the precise value of Q that is ultimately chosen.

In a similar fashion, a one-bit signal that approximates a cubic function of the modulator input can be fashioned by observing the current modulator output plus the previous two bits. The Gray-coded truth table for a three-bit product, and then applying a cubic compensation "C," is shown in TABLE 3:

TABLE 3

| msb (current) | lsb (previous) | lsb (oldest) | product/ compensation |
|---|---|---|---|
| −1 | −1 | −1 | −C |
| −1 | −1 | +1 | +C |
| −1 | +1 | +1 | −C |
| −1 | +1 | −1 | +C |
| +1 | +1 | −1 | −C |
| +1 | +1 | +1 | +C |
| +1 | −1 | +1 | −C |
| +1 | −1 | −1 | +C |

The average duty factor obtained from the encoding shown in TABLE 3 closely approximates a cubic function relative to the average modulator input. This encoding is obtained by taking the product of the three most recent modulator output samples. The output is roughly proportional to the cube of the input, plus a linear term. Analogous to the offset introduced by the quadratic compensation, any unwanted linear term introduced by the cubic compensation can be absorbed into a general gain compensation of the system.

A somewhat simpler encoding exists that also generates very good approximations to quadratic and cubic transfer functions, and is shown in TABLE 4.

TABLE 4

| msb (current) | lsb (previous) | lsb (oldest) | product/ compensation |
|---|---|---|---|
| −1 | −1 | −1 | +C |
| −1 | −1 | +1 | +Q |
| −1 | +1 | +1 | +Q |
| −1 | +1 | −1 | +Q |
| +1 | +1 | −1 | +Q |
| +1 | +1 | +1 | −C |
| +1 | −1 | +1 | +Q |
| +1 | −1 | −1 | +Q |

It is preferred to use this encoding for the combined quadratic and cubic compensation. Different compensation values (e.g., "+Q", "+C," or "−C") are applied at mutually exclusive times. Therefore, with the preferred encoding, even though two different effects are being compensated for (2nd-order and 3rd-order distortion), at any given clock cycle only one number is added to the modulator input. This means that one additional adder input to the modulator can perform both compensations on a time-shared basis. In effect, since the three different numbers are never decoded at the same time, they can be "added" together with a bank of 3-input "OR" gates rather than a bank of 3-input adders. This "sum" is then used for the compensation.

In the embodiment represented by TABLE 4, the quadratic expression has been expanded to utilize information from the third bit. This encoding can be shown to be equivalent to passing the one-bit output of the modulator through a 3-tap equal-weighted moving-average FIR filter, then squaring the result, ignoring for the moment any offset and scaling factor. The use of an extra bit and the filtering operation in computing the quadratic term in TABLE 4 has the advantage of improving the signal-to-noise ratio vs. the encodings shown in TABLES 1-3.

Figure 4:
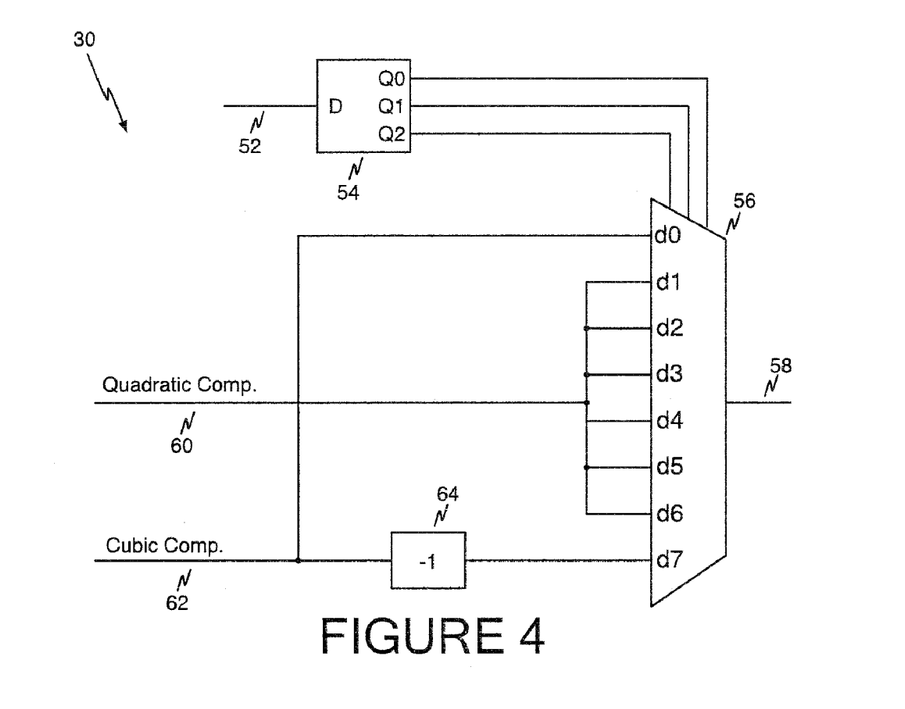
FIG. 4 is a block diagram of an illustrative compensation circuit that may be used to add compensation in accordance with the present invention.

Referring now to FIG. 4, a block diagram of an illustrative compensation circuit 50 that may be used to implement the present invention is shown. The output of the sigma-delta modulator is presented on line 52 to shift register 54. In FIG. 4, shift register 54 is shown having three stages, representing the current output bit, the immediately previous output bit and the second immediately previous output bit from the sigma-delta modulator. Persons of ordinary skill in the art will appreciate that shift register 54 can be provided with the appropriate number of stages as required when other numbers of bits are examined to generate the quadratic and cubic corrections in accordance with the present invention.

The bits held in shift register 54 are used to drive the address inputs of multiplexer 56. The multi-bit output of multiplexer 56 is presented on lines 58. Multiplexer 56 is shown as an 8-input multiplexer, since, for the illustrative embodiment shown, eight data inputs ($d_0$ through $d_7$) are needed, corresponding to all the combinations of three address bits. As may be seen from an examination of FIG. 4, data inputs $d_1$ through $d_6$ are coupled in common to the quadratic compensation term Q on lines 60. Data input $d_0$ is coupled to the cubic compensation term C on lines 62 and data input $d_7$ is coupled to the cubic compensation term C through complementing circuit 64.

As will be appreciated by persons of ordinary skill in the art, the circuit shown in FIG. 4 implements the compensation scheme shown in Table 4. Address 000 ($d_0$) passes the compensation term +C through multiplexer 56, address 111 passes compensation term −C through multiplexer 56, and all other address combinations pass compensation term +Q through multiplexer 56.

FIG. 4 shows that a single 8-input multiplexer can be used to decode both the quadratic and cubic compensations when using the encoding scheme of TABLE 4. Persons of ordinary skill in the art will see that the logic in the decoder in the multiplexer can be minimized either manually or automatically by a logic synthesis tool and that the same functionality can be described in many different ways using different primitive blocks or text-based languages, for example. A few gates can be saved by using the one's complement of the cubic compensation rather than the two's complement, as the difference is negligible if properly scaled. Alternatively, since C is generally static, −C could be pre-computed and stored rather than being computed combinatorially in real time. Although C (and Q) and its ones- or twos-complement are the preferred inputs to the multiplexer in order to generate a compensation signal having values and associated duty factors that together approximate a cubic (or quadratic) function of the modulator input, as used in this disclosure, the term "complement" includes the many values related to C or Q that will also generate approximately cubic or quadratic functions when modulated by the multiplexer duty factor and that could be used for purposes of compensation. Some related values to C and Q would include any constant scaling of C or Q (positive or negative). In addition, linear combinations of C and Q might be used where the duty factors for applying them overlap in time.

Figure 5:
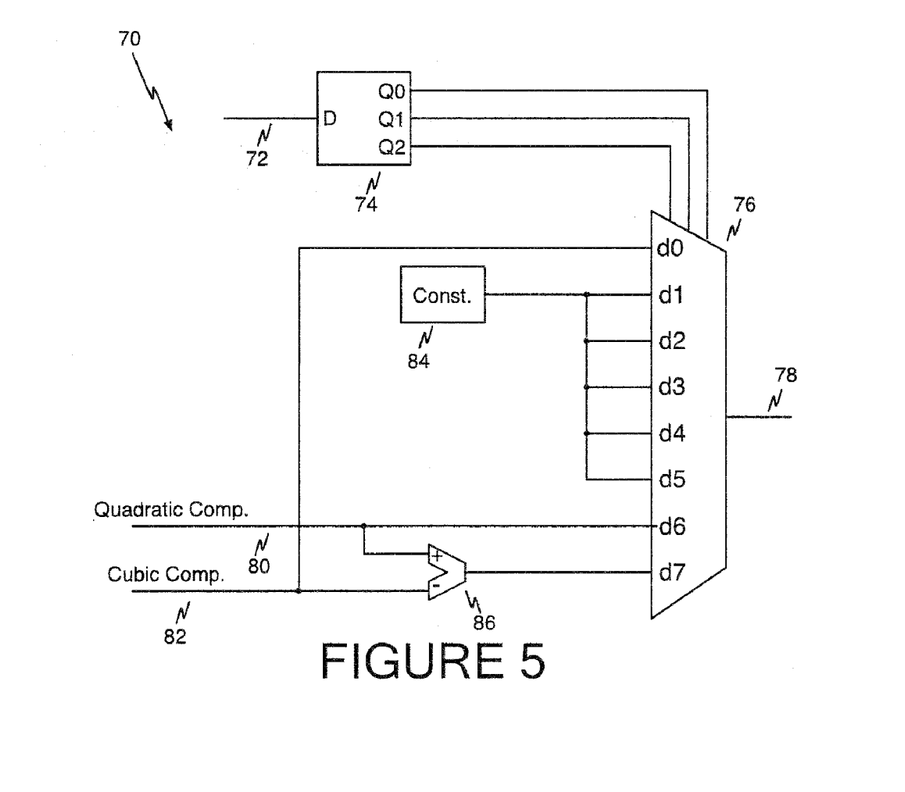
FIG. 5 is a block diagram of another illustrative compensation circuit that may be used to add compensation in accordance with the present invention.

Referring now to FIG. 5, a block diagram of another illustrative compensation circuit 70 that may be used to implement the present invention. The output of the sigma-delta modulator is presented on line 72 to shift register 74. In FIG. 5, shift register 74 is shown having three stages, representing the current output bit, the immediately previous output bit and the second immediately previous output bit from the sigma-delta modulator. Persons of ordinary skill in the art will appreciate that shift register 74 can be provided with the appropriate number of stages as required when other numbers of bits are examined to generate the quadratic and cubic corrections in accordance with the present invention.

The bits held in shift register 74 are used to drive the address inputs of multiplexer 76. The multi-bit output of multiplexer 76 is presented on lines 78. Multiplexer 76 is shown as an 8-input multiplexer, since, for the illustrative embodiment shown, eight data inputs ($d_0$ through $d_7$) are needed. As may be seen from an examination of FIG. 5, data input d3 is coupled to the quadratic compensation term on lines 80, data input $d_0$ is coupled to the cubic compensation term C on lines 82, and data inputs $d_1$, $d_2$, $d_4$, $d_5$, and $d_6$ are coupled in common to a constant shown at lines 84. Data input $d_7$ is coupled to the output of adder 86, which is used to sum the quadratic compensation term Q and the cubic compensation term C. If both C and Q are static, then their sum may be precomputed and stored rather than being computed combinatorially in real time.

As will be appreciated by persons of ordinary skill in the art, the circuit shown in FIG. 5 implements a combination of the quadratic compensation where Q is added only when the two most recent modulator output bits are "11" and the cubic compensation is as shown in TABLE 4. Address 000 ($d_0$) passes the compensation term +C through multiplexer 76, address 111 ($d_7$) passes compensation term (−C+Q) through multiplexer 76, address 110 ($d_6$) passes compensation term +Q through multiplexer 76, and all other address combinations pass the constant 0 through multiplexer 76. Although this quadratic term is somewhat noisier, and introduces larger gain and offset side-effects than several of the other examples shown, it does have the predominantly second-order duty factor characteristic that is desired for use in compensating second-order circuit errors.

Figure 6:
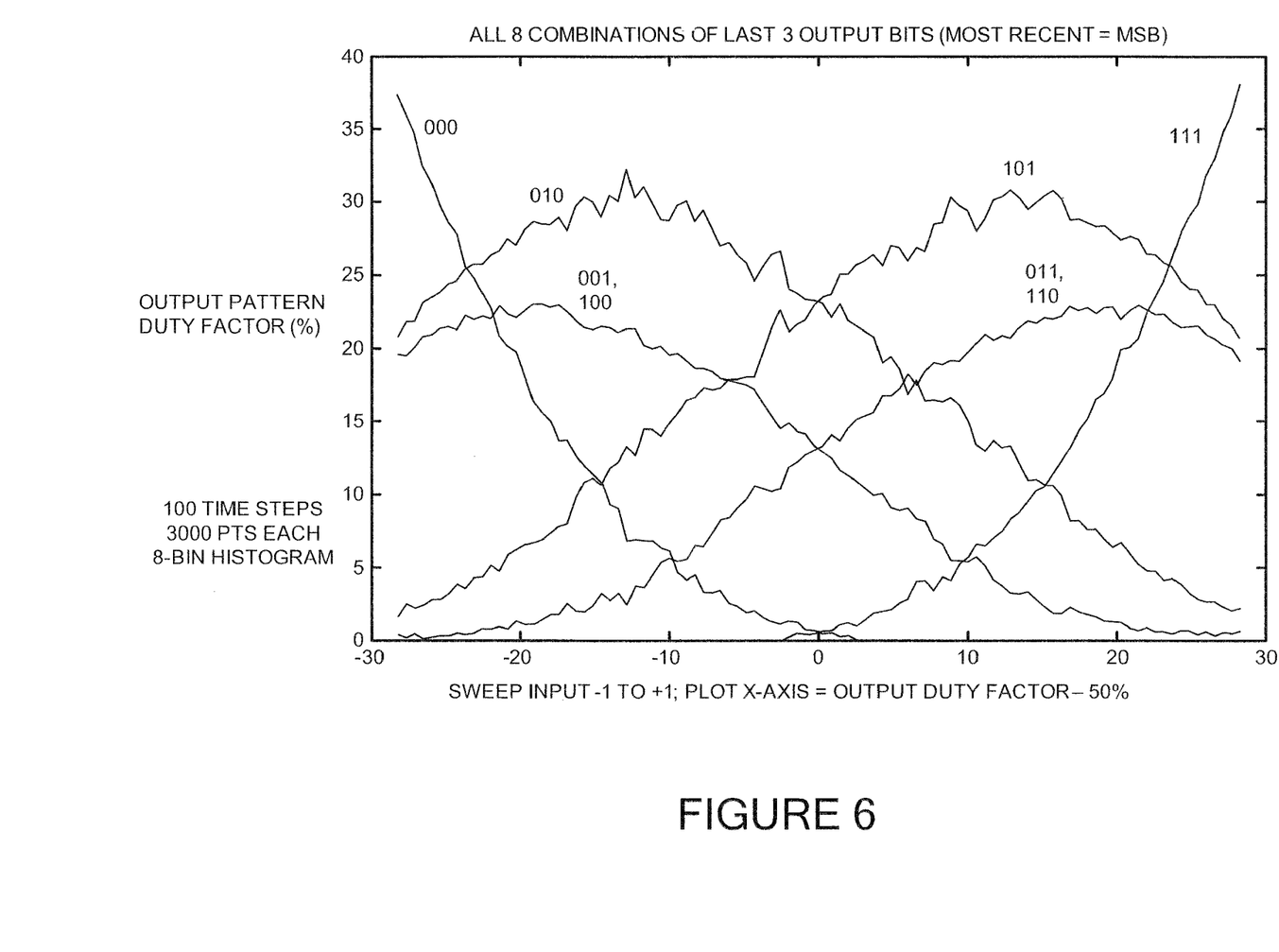
FIG. 6 is a plot showing histograms for the output of a fourth-order modulator with its input swept over its useable input range.
Figure 7:
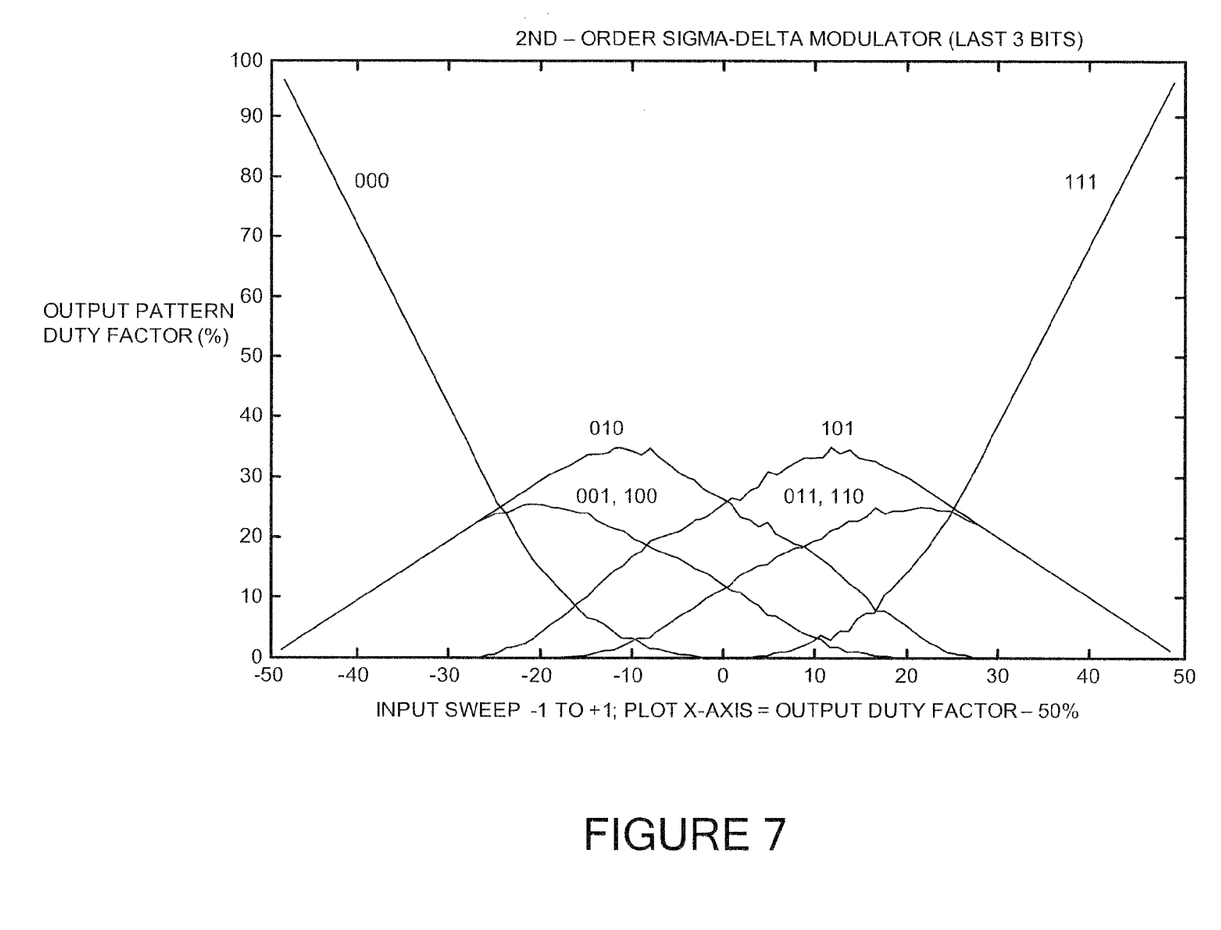
FIG. 7 is a plot showing histograms for a second-order modulator with its input swept over its useable input range.

The present invention works well with higher-order modulators such as a fourth-order modulator where the quadratic and cubic curves generated by the encoding are closer to ideal, but provides benefit with lower-order modulators, albeit with slightly higher harmonic content. FIG. 6 shows histograms for the output of a fourth-order modulator with its input swept over its useable input range. The plots of FIG. 7 show similar results for a second-order modulator.

The one-bit output of a Sigma-Delta modulator contains a large amount of quantization noise but, as is well known, that noise is shaped in the frequency domain away from the primary signals of interest. Because of this separation in the frequency domain, conventional analog or digital filters may be used to remove the noise and keep the signal.

Multiplication of successive output bits of the modulator in the time domain is like convolution in the frequency domain. Unfortunately, this means that some of the large amount of out-of-band quantization noise is "smeared" into the signal band, leaving only a vestige of the original noise-shaping. As such, the signal-to-noise ratio is not as high for the one-bit squared and cubed compensation signals as it is for the normal one-bit linear output of the Sigma-Delta modulator. Therefore, the amount of compensation that can be applied before the noise floor of the complete system is significantly raised is limited. This is generally acceptable, as the non-linearity being compensated should also be limited by design. The noise floor can also be enhanced by incorporating more information, such as been demonstrated for the preferred quadratic encoding.

Another reason that the compensation applied cannot be made too large is that it may cause the Sigma-Delta modulator in the D/A converter to become dynamically unstable. As long as the amount fed-back for compensation is small, this should not be a major concern. Note that this is not a concern for any implementations where the compensation is fed-forward, such as may be the case when applying digital compensation to a Sigma-Delta A/D converter.

Although most of the disclosure herein is with respect to a Sigma-Delta D/A converter using a digital Sigma-Delta modulator, it should be relatively straightforward to see how the feedback compensation concept can apply to an A/D converter using an analog modulator and some medium resolution D/A converters to convert the digitally stored static compensation values Q and C to analog signals. These D/A converters could be very low cost, since they require no bandwidth. Alternatively, these signals could come from potentiometers. Then, an advantage the invention provides is that it eliminates the need for analog (as opposed to digital) multipliers to compute the square or cube of the A/D input, or to compute the product of the square or cube with the static Q or C signals. As shown above, the quadratic- or cubic-encoded signals are developed from the modulator output without the use of expensive multipliers. The multiplication of the analog Q and C signals can be done using simple digitally-controlled analog switches (or switched-capacitors) that are controlled according to the duty factor of the one-bit quadratic- or cubic-encoded signal, respectively. The resulting compensation signal(s) can be added to the analog input of the A/D converter, thus pre-compensating its non-linearity in the analog domain.

Alternatively, rather than feeding-back and pre-compensating the input of the A/D modulator (as in the case of the D/A), for the A/D it makes more sense for the output of the modulator to be fed-forward and post-compensated entirely in the digital domain. Conversely, the D/A compensation could be done on a feed-forward basis by using some additional DACs (or potentiometers) and analog switches (or switched capacitors) to apply the quadratic and cubic corrections in the analog domain, eliminating any concerns about affecting the modulator stability. If applied before the analog output filter, most of the quantization noise in the compensation signal(s) will be removed by the filter.

Although most of the disclosure herein has been with regard to compensation using a one-bit (i.e., two-level) modulator, the concepts of the present invention can be extended to modulators with more levels, such as one driving a three-, four-(or more) level "thermometer" D/A converter. It will be found that a simple encoder, in the style of those shown, can be constructed using the available modulator output symbols from the current clock cycle or from the current clock cycle, one or more previous clock cycles, or current and previous clock cycles that makes a low-resolution approximation to a quadratic or cubic function suitable for applying compensation to the modulator, without the use of high-cost multipliers.

When a multi-bit sigma-delta modulator is used, useful results may be obtained without having to use all the output bits. For example, if a four-level sigma-delta modulator is used instead of the two-level binary modulator, a simple encoding that would approximate a quadratic function of the modulator input would be to encode "one" for the cases where the modulator output is at either its lowest or highest extreme codes, and "zero" for the remaining two cases where the modulator output is either of the two middle codes. In this case, only the current modulator output sample is needed to encode a simple low-resolution signal that has a duty factor that approximates a quadratic function of the modulator input; previous samples are not required in this example. While most of the examples here have been using the most recent several bits out of a single-bit sigma-delta modulator, anyone who is skilled in the art should be able to extrapolate from the examples provided to design low bit-count encoders that use some or all the output bits of the sigma-delta modulator, from one or more time samples. The encoded quadratic or cubic (or higher-order) value can then be efficiently multiplied by the appropriate calibration coefficient and used to compensate the A/D or D/A converter.

With a fairly small amount of additional logic, it is possible to lower the noise floor in the encoded signal by using several extra modulator output bits. An encoding using three bits from the modulator to encode the quadratic compensation has been shown in TABLE 4. This can be extended to even more bits. For example, the encoding shown in TABLE 5 uses the most recent four bits from the modulator to compute reduced noise quadratic and cubic functions. These encodings are equivalent to running the four bits through a four-tap equal-weighted moving-average FIR filter, then squaring (or cubing) the result. Note that the only multiplications required are powers-of-two, i.e., they can be implemented just by shifting the wires representing the coefficients going to the decoding logic. Since the quadratic and cubic compensations now overlap in time, an adder would be required to use both. Some or all the terms could be pre-computed.

TABLE 5

| (ref) | msb (current) | | | lsb (oldest) | Quadratic Compensation | Cubic Compensation |
|---|---|---|---|---|---|---|
| 0 | −1 | −1 | −1 | −1 | +4 * Q | −8 * C |
| 1 | −1 | −1 | −1 | +1 | +Q | −C |
| 3 | −1 | −1 | +1 | +1 | 0 | 0 |

TABLE 5-continued

| (ref) | msb (current) | | | lsb (oldest) | Quadratic Compensation | Cubic Compensation |
|---|---|---|---|---|---|---|
| 2 | −1 | −1 | +1 | −1 | +Q | −C |
| 6 | −1 | +1 | +1 | −1 | 0 | 0 |
| 7 | −1 | +1 | +1 | +1 | +Q | +C |
| 5 | −1 | +1 | −1 | +1 | 0 | 0 |
| 4 | −1 | +1 | −1 | −1 | +Q | −C |
| 12 | +1 | +1 | −1 | −1 | 0 | 0 |
| 13 | +1 | +1 | −1 | +1 | +Q | +C |
| 15 | +1 | +1 | +1 | +1 | +4 * Q | +8 * C |
| 14 | +1 | +1 | +1 | −1 | +Q | +C |
| 10 | +1 | −1 | +1 | −1 | 0 | 0 |
| 11 | +1 | −1 | +1 | +1 | +Q | +C |
| 9 | +1 | −1 | −1 | +1 | 0 | 0 |
| 8 | +1 | −1 | −1 | −1 | +Q | −C |

One limitation to using larger numbers of modulator bits (here meaning multiple time samples) is increasing the magnitude and phase error of the compensation for dynamic input signals. In feed-forward systems the phase error can easily be compensated by putting a matching delay in the main signal path (for example, delay line 36 in FIG. 2); and the phase error is generally much more significant than the magnitude error for the high over-sampling ratios used, therefore this approach is effective. In feedback systems it is more difficult to deal with these dynamic errors.

The disclosure has focused upon compensation terms that approximate relatively independent quadratic and cubic functions. The linear output (i.e., gain) of the modulator can also be trimmed using just the current output bit, eliminating the need for a multiplier for the gain compensation. However, care must taken to not make such a large change that the modulator loop stability is endangered. This might occur if limits on the input signal range are effectively defeated by making too large of a gain change without making a corresponding change in the input signal limits. For a multi-bit modulator, the loop gain could also be affected, potentially creating a less stable system. Higher-order compensation terms, such as 4th-order, could also be provided for: The invention is not limited to quadratic or cubic-like terms.

Instead of absorbing any unwanted offset and gain changes introduced by the quadratic and cubic compensation terms, respectively, in the overall system gain and offset calibration, they could easily be adjusted as desired, or cancelled, by adding the quadratic compensation value Q, appropriately scaled for the desired effect on offset, to the modulator input on a one-hundred percent basis to compensate the offset the quadratic compensation introduces; or by adding an appropriately scaled cubic compensation value C to the modulator input when the current output bit is a one, and subtracting it when the output is a zero, to achieve the desired overall slope for the compensation. On the other hand, a more efficient implementation can often be obtained by allowing the offset to be chosen arbitrarily by the designer, and for it to be absorbed in an overall offset compensation, as has been done in the examples shown.

Calibration refers to the determination of suitable values for the Quadratic or Cubic compensation values (Q and C). In most cases, these values will be determined during the manufacturing test process and will be static. The compensation values may be stored in any suitable type of memory, for example, non-volatile flash memory embedded in the same device that is being calibrated. If the variation from device-to-device is small compared to the cubic or quadratic errors of a lot, or of all devices of that design, then it may be possible to calibrate by lot, or to use the same calibration values for all devices of the same type. In most cases, other effects such as temperature and power supply variation do not materially affect the quadratic or cubic errors, and can safely be ignored. If this is not the case, then the calibration values, instead of being static, may be dynamically computed based upon measurements made of temperatures, power supply voltages, or any other independent variable that has a marked effect upon them.

Techniques for determining suitable values for Q and C should be well known by those of ordinary skill in the art. A quick review of two methods follows.

There are several ways to determine what the calibration coefficient should be. One way is using DC measurements of the linearity of the DAC or ADC being examined. If cubic compensation is desired, then at least four measurements of the input/output relationship of the device under test ("DUT") should be taken. If only a quadratic compensation is desired, a minimum of three distinct measurements should be performed. For best results, these points should be widely spaced over the range of the DUT. Taking additional measurements will usually improve the results, statistically. If much noise is present, averaging of the output measurements at each distinct input point may also prove to be helpful.

If the measured input/output pairs all form an exactly straight line when plotted using Cartesian coordinates, then no quadratic or cubic compensation is required, i.e., those coefficients can be set to zero, and only gain and offset corrections may need to be applied. Gain and offset compensations can be applied in any number of well known ways: for example, the input to a D/A converter can be pre-computed to compensate for the gain and offset errors of the D/A converter, the gain and offset coefficients could be applied using hardware in the modulator, the gain can be compensated by, for example, adjusting the feedback gain factor of one-bit Sigma-Delta modulator (thus avoiding multi-bit multiplication).

In the more usual case, the input/output pairs do not initially describe a line, but rather there exist some small deviations from a straight line. One way to determine the quadratic and cubic calibration coefficients would be to iteratively adjust them until the measurements were sufficiently close to an ideal straight line. If more than four distinct measurements are used, there may, after calibration, still remain some deviation from a straight line due to higher order effects.

The effect of a quadratic compensation coefficient is to bow the response of the converter above or below its uncompensated response. Likewise, the effect of a cubic compensation coefficient is to bend one-half of the response "up" and the other half "down." Depending upon which coding scheme is used, the effect may be positive or negative, and it may also affect the gain or offset to some degree. There is very little interaction, however, between the quadratic and cubic coefficients. Thus, the cubic and quadratic coefficients should be adjusted first, in either order, followed by any final gain or offset correction.

Since, for any specific modulator and compensator design, the effects of the compensation coefficients are deterministic, the entire procedure can be automated and performed with just a single iteration. For example, the input/output pairs can be fit to a cubic polynomial using an optimization criterion such as minimizing the sum of the squared residuals. The designer, knowing the magnitude and phase of the effect the cubic and quadratic coefficients have on that particular implementation, can calculate from the 2nd and 3rd-order polynomial coefficients fit to the measurements what number to use for the compensation coefficients Q and C. Depending upon the coding scheme used, the designer would know how much the selected quadratic and cubic calibration coefficients affected the gain and offset, and then, along with the 0th and 1st order polynomial coefficients, the designer could determine the final gain and offset corrections suitable for that implementation.

As an alternative to using DC measurements, the calibration may be performed in the frequency domain. This is accomplished by stimulating the DUT with a pure nearly full-scale sinewave, at a frequency chosen well below the top bandwidth of the circuit. It is often also helpful if an integer number of cycles of the sinewave and its first and second harmonics fit exactly into the number of samples to be analyzed, so as to reduce window leakage effects (especially if a rectangular window is used). The number of samples, in turn, is often selected as a power-of-two, so that simple versions of the FFT algorithm may be used for the analysis. In this approach, the output samples are converted from the time domain to the frequency domain using the DFT or FFT algorithm. The phase relation between the input and output must be known, at least approximately, accounting for any phase shifts or latency introduced in the circuit.

Any quadratic non-linearity in the response of the DUT will appear as a spur at the first harmonic frequency (i.e., twice the input frequency); any cubic non-linearity as a spur at the second harmonic (i.e., three times the input frequency). In effect, the FFT analysis computes the least-squares best-fit polynomial coefficients. The magnitude of the spurs corresponds to the magnitude of quadratic or cubic compensation required, and the phase indicates whether the correction should be positive or negative.

Figure 8:
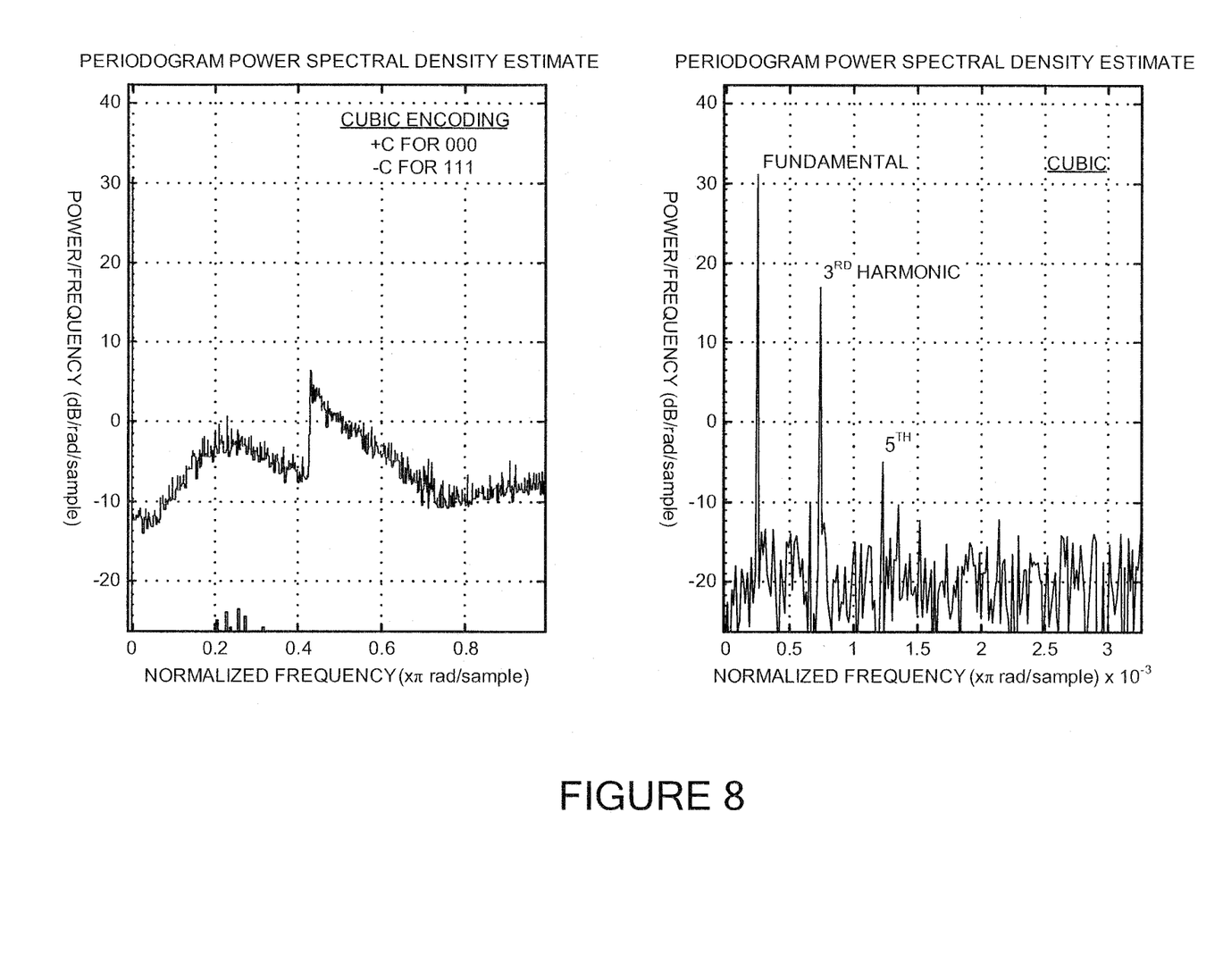
FIGS. 8 and 9 are graphs that show examples of the effect of quadratic and cubic coefficients as analyzed in the frequency domain.
Figure 9:
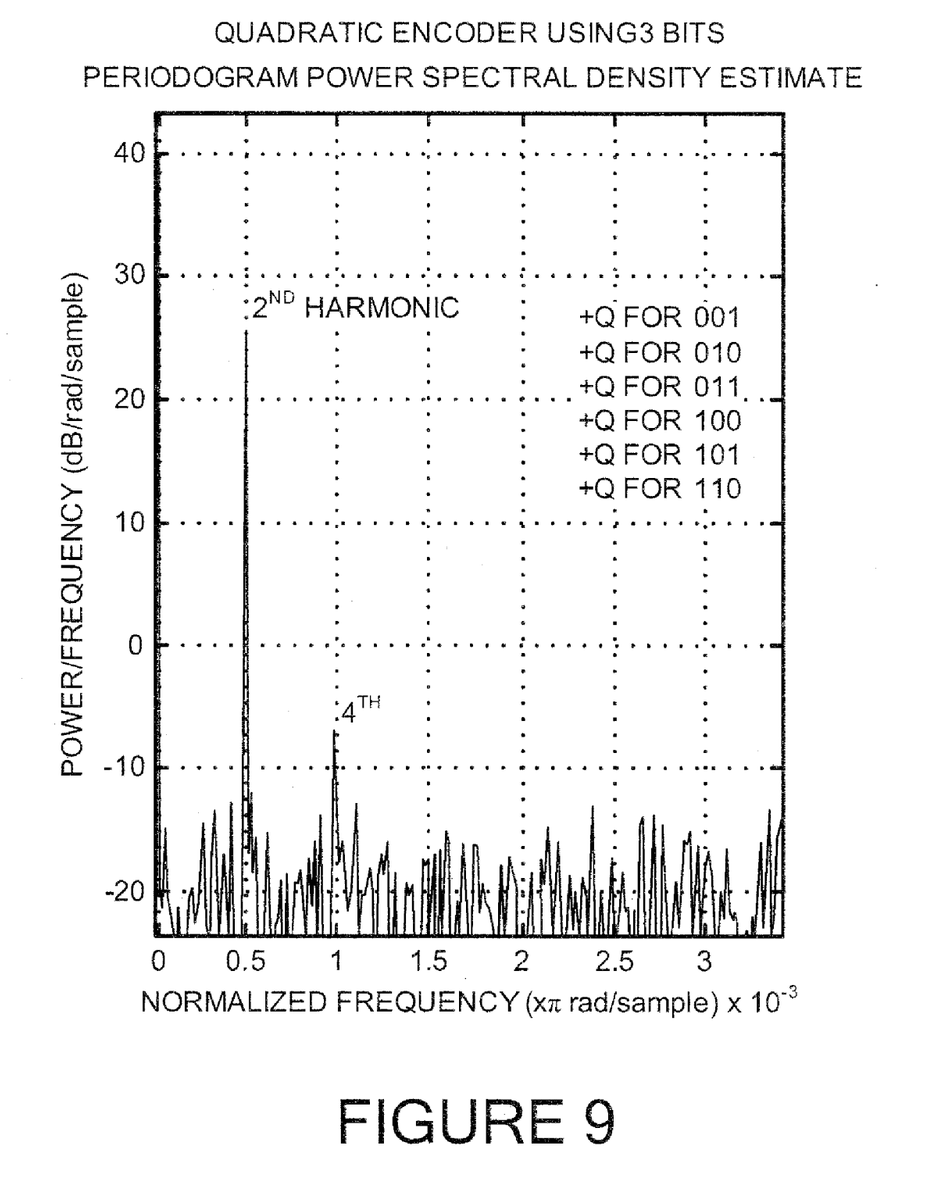

When properly compensated, the first and second harmonics should be reduced to the level of the noise floor. FIGS. 8 and 9 show examples of the effect of the quadratic and cubic coefficients as analyzed in the frequency domain. Compensation consists of applying these coefficients with the correct sign and magnitude so as to be equal and opposite to harmonic spurs measured in the uncompensated response of the DUT to the same sinewave. As before, after the quadratic and cubic compensations are applied, the final gain and offset calibration may be performed.

There are many ways of encoding the output of the sigma-delta modulator, using just one or a few bits, to represent a quadratic or cubic function of the modulator input such that inexpensive multipliers may be utilized for computing a useful non-linear compensation factor. The logic tables presented above represent only a few of the possible useful encodings. For example, using just the current bit and the previous bit from a one-bit sigma-delta modulator, there are four possible combinations (of these two bits). Considering all possible binary-valued outputs of these four input combinations, there are sixteen possible functions. Of these, there is one trivial case (the function whose output is always zero; 0% duty factor), one case that generates a DC offset (always one; 100% duty factor), and four cases that generate a duty factor linearly or inversely proportional to the modulator input (including the functions that output the modulator output bit directly, or the output delayed, and the inverses of these two cases). All ten of the remaining binary-valued functions generate a duty factor having a strong quadratic relationship to the modulator input. Of these ten, the XOR, XNOR, and AND functions have been discussed above; but any of these ten functions (i.e., encodings) would be satisfactory for purposes of quadratic compensation, albeit they may have a more or less desirable offset or gain contribution.

When functions of more than two bits, and functions that have more than two output symbols (e.g., $\{1, 0, -1\}$ such as in TABLE 4, or $\{-8, -1, 0, 1, 8\}$ such as in TABLE 5), and modulators with more than a one-bit output are considered, the number of potential encodings can be seen to be quite large. As shown in the previous paragraph, many of these encodings may be useful for compensation purposes. TABLE 5 discloses one good encoding for quadratic compensation, and one for cubic compensation. Given 4 binary inputs and an output symbol set that includes {−8, −4, −2, −1, 0, 1, 2, 4, 8}, there are more than 68 billion other possible functions (encodings), some of which are bound to be useful for purposes of compensation within the spirit of the invention. The symbol sets shown here are meant to be illustrative of sets that can be implemented inexpensively, i.e., without the use of expensive multipliers. Other symbol sets are possible using numbers related to C or Q, or combinations of C and Q that can provide useful compensation capability inexpensively, especially considering that any related number could be pre-computed and stored, rather than computed from C or Q in real time.

Figure 10:
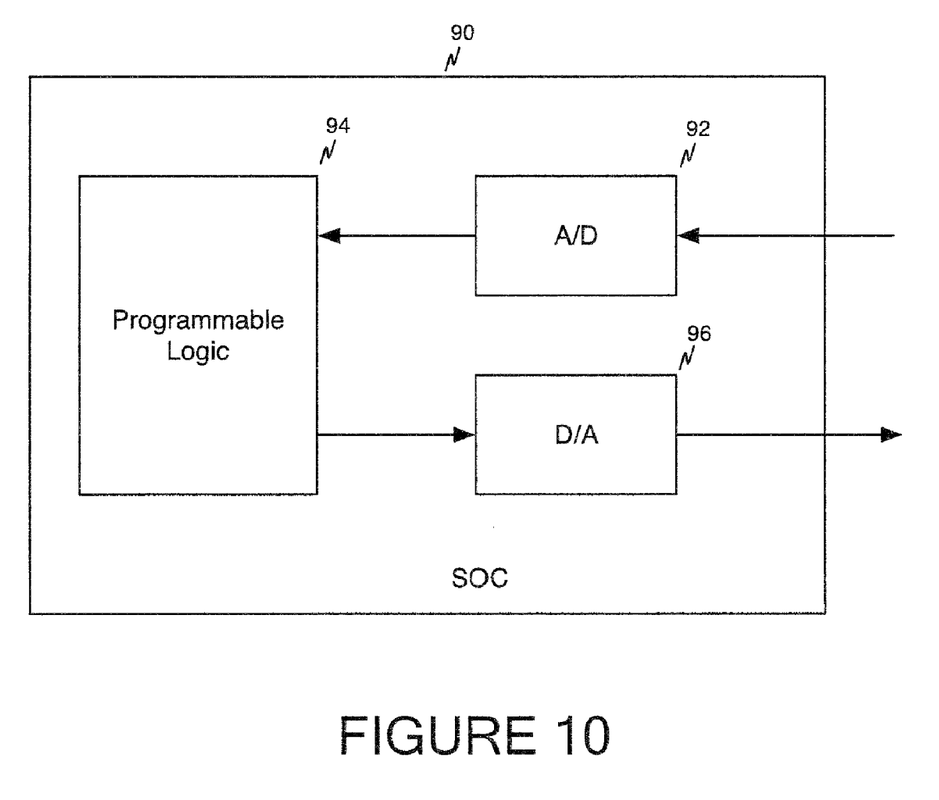
FIG. 10 is a diagram showing an illustrative application employing the concepts of the present invention.

Referring now to FIG. 10, a diagram shows an illustrative application employing the concepts of the present invention. In the illustrative application shown in FIG. 10, system-on-a-chip (SOC) integrated circuit 90 includes a sigma-delta A/D converter 92 that may receive an analog input signal from off chip. The output of sigma-delta A/D converter 92 is presented to configurable logic block 94, where it may be processed according to a user configuration programmed into configurable logic block 94. An output of configurable logic block 94 is sent to sigma-delta D/A converter 96, whose analog output is provided to off-chip circuitry. Either one or both of sigma-delta A/D converter 92 and sigma-delta D/A converter 96 may be compensated as discussed herein. Connections between the configurable (programmable) logic block 94 and the D/A and A/D converter circuits 96 and 92 may include programmable and hardwired routing connections.

Some of functions of the sigma-delta converters, specifically the digital functions such as the quadratic and cubic compensation functions being discussed herein, and the digital sigma-delta modulator in the D/A converter, may be performed in a configurable (programmable) logic block, such as a field programmable gate array or a complex programmable logic array. Even if portions of the A/D and D/A sigma-delta converters are implemented as hardwired integrated circuits, if a low-resolution modulator output is available, then the compensation can be computed without the use of multi-bit multipliers, using the methods prescribed; and this may be done using programmable logic.

A sigma-delta D/A converter can be constructed using programmable logic for both the sigma-delta modulator, and the compensation logic. Where high accuracy is not required, esp. with regard to power supply rejection capability, an ordinary low-cost digital I/O driver can be used as the one bit D/A converter. This would typically be followed by an analog filter at the circuit board level to remove the quantization noise. Using a digital I/O driver for the digital-to-analog conversion function may result in relatively high levels of INL, which the invention can inexpensively reduce by pre-compensating it in the digital domain within the programmable logic.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for compensating a sigma-delta modulator having an input and an output, comprising:

provid ing a binary word Q that represents a desired amount of quadratic compensation;
encoding from the output of the sigma-delta modulator a low-resolution signal having a value and a duty factor that together approximate a quadratic function of the sigma-delta modulator input;
multiplying the binary word Q by the low-resolution signal to generate a resultant number; and
adding the resultant number to one of the sigma-delta modulator input and the sigma-delta modulator output.

2. The method of claim 1, wherein: the low-resolution signal is a one-bit signal.

3. The method of claim 2, wherein encoding from the output of the sigma-delta modulator a low-resolution signal having a value and a duty factor that together approximate a quadratic function of the sigma-delta modulator input includes:

examining a current output bit and an immediately previous output bit of the sigma-delta modulator; and
generating a one-bit signal having a binary value of one when the current output bit and the immediately previous output bit of the sigma-delta modulator are the same and having a binary value of zero when the current output bit and the immediately previous output bit of the sigma-delta modulator are different.

4. The method of claim 3, wherein generating the one-bit signal includes:

storing the immediately previous output bit of the sigma-delta modulator for one clock cycle; and
performing an XNOR function on the current output bit of the sigma-delta modulator and the immediately previous output bit of the sigma-delta modulator.

5. The method of claim 1, wherein providing a binary word Q that represents a desired amount of quadratic compensation includes:

storing the binary word Q in non-volatile memory.

6. The method of claim 1, further comprising:

applying cubic compensation to one of the sigma-delta modulator input and the sigma-delta modulator output.

7. The method of claim 6, wherein applying cubic compensation to one of the sigma-delta modulator input and the sigma-delta modulator output includes:

providing a binary word C that represents a desired amount of cubic compensation;
examining a current output bit, a first immediately previous output bit, and a second immediately previous output bit of the sigma-delta modulator; and
adding C to one of the modulator input and the modulator output when all of:
the current output bit,
a first immediately previous output bit, and
a second immediately previous output bit
of the sigma-delta modulator have binary value zero; and
when only one of:
the current output bit,
the first immediately previous output bit, and
the second immediately previous output bit
of the sigma-delta modulator has binary value zero; and
adding a complement of C to the modulator output when all of:
the current output bit,
the first immediately previous output bit, and
the second immediately previous output bit of the sigma-delta modulator have binary value one; and
when only one of:
the current output bit,
the first immediately previous output bit, and the second immediately previous output bit of the sigma-delta modulator has binary value one.

8. A method for compensating a sigma-delta modulator having an input and an output including:
providing a binary word C that represents a desired amount of cubic compensation;
encoding from the output of the modulator a low-resolution signal having a value and a duty factor that together approximate a cubic function of the sigma-delta modulator input;
multiplying the binary word C by the low-resolution signal to create a resultant number;
applying the resultant number to one of the sigma-delta modulator input and the sigma-delta modulator output.

9. The method of claim 8, wherein providing a binary word C having a duty factor that represents a desired amount of cubic compensation includes storing the binary word C in non-volatile memory.

10. The method of claim 8, further comprising:
examining a current output bit, a first immediately previous output bit, and a second immediately previous output bit of the sigma-delta modulator; and
adding C to one of the modulator input and the modulator output; when all of:
the current output bit,
a first immediately previous output bit, and
a second immediately previous output bit
of the sigma-delta modulator have binary value zero; and when
only one of:
the current output bit,
the first immediately previous output bit, and
the second immediately previous output bit
of the sigma-delta modulator has binary value zero; and
adding the complement of C to the modulator output; when all of:
the current output bit,
the first immediately previous output bit, and
the second immediately previous output bit of the sigma-delta modulator have binary value one; and when
only one of:
the current output bit,
the first immediately previous output bit, and
the second immediately previous output bit of the sigma-delta modulator has the value one.

11. A method for compensating a sigma-delta modulator having an input and an output comprising:
providing a binary word Q that represents a desired amount of quadratic compensation;
providing a binary word C that represents a desired amount of cubic compensation;
examining a current output bit, a first immediately previous output bit, and a second immediately previous output bit of the sigma-delta modulator; and
selecting a value, wherein:
the value is C when all of:
the current output bit,
the first immediately previous output bit, and
the second immediately previous output bit
of the sigma-delta modulator have binary value zero;
the value is a complement of C when all of:
the current output bit,
the first immediately previous output bit, and
the second immediately previous output bit
of the sigma-delta modulator have binary value one; and
otherwise the value is Q; and applying the selected value to one of the sigma-delta modulator input and the sigma-delta modulator output.

12. The method of claim 11, wherein:
providing a binary word Q that represents a desired amount of quadratic compensation includes storing the binary word Q in non-volatile memory; and
providing a binary word C that represents a desired amount of cubic compensation includes storing the binary word C in non-volatile memory.

13. A method for compensating a sigma-delta modulator having an input and an output comprising:
providing at least one of a binary word Q that represents a desired amount of quadratic compensation and a binary word C that represents a desired amount of cubic compensation;
providing a compensation algorithm for applying from:
the current output of the sigma-delta modulator; and
at least one immediately-previous output of the sigma-delta-modulator:
compensation related to at least one of Q and C;
examining a current output of the sigma-delta modulator and at least one immediately-previous output of the sigma-delta-modulator; and
applying compensation related to at least one of Q and C in accordance with the algorithm to at least one of the sigma-delta modulator input and the sigma-delta modulator output.

14. The method of claim 13, wherein providing at least one of a binary word Q that represents a desired amount of quadratic compensation and a binary word C that represents a desired amount of cubic compensation includes storing the at least one of the binary word Q and the binary word C in non-volatile memory.

15. The method of claim 13, wherein:
providing a compensation algorithm for applying from the current output of the sigma-delta modulator and at least one immediately-previous output of the sigma-delta-modulator compensation related to at least one of Q and C includes:
encoding a quadratic and cubic compensation algorithm from the current output of the sigma-delta modulator and a selected number of immediately-previous outputs of the sigma-delta-modulator; and
examining the current output of the sigma-delta modulator and at least one immediately-previous output of the sigma-delta-modulator includes:
examining the current output of the sigma-delta modulator and a selected number of immediately previous outputs of the sigma-delta modulator.

16. The method of claim 15, wherein:
the selected number of immediately-previous outputs is two.

17. The method of claim 15, wherein:
the selected number of immediately-previous outputs is three.

18. A compensation circuit for a sigma-delta modulator comprising:
a shift register for storing at least one most-recent output bit from a sigma-delta modulator, the shift register having at least one output;
a storage location for storing a quadratic compensation value;
and
a logic unit having an output providing, in response to the at least one output of the shift register, one of:
the quadratic compensation value; and one of a complement of the quadratic compensation value and a fixed constant value.

19. The compensation circuit for a sigma-delta modulator of claim 18, wherein:
the logic unit comprises a multiplexer having at least one select input coupled to an output of the shift register, and a plurality of data inputs, each data input coupled to a node presenting one of:
the quadratic compensation value;
the complement of the quadratic compensation value, and
the fixed constant value.

20. A compensation circuit for a sigma-delta modulator comprising:
a shift register for storing at least one most-recent output bit from a sigma-delta modulator, the shift register having at least one output;
a first storage location for storing a cubic compensation value;
a second storage location for storing a fixed constant;
a complementing circuit having an input coupled to the first storage location and further having an output; and
a logic unit having an output providing, in response to the at least one output of the shift register, one of:
the cubic compensation value;
a complement of the cubic compensation value, and
the fixed constant value.

21. The compensation circuit for a sigma-delta modulator of claim 20, wherein: the logic unit comprises a multiplexer having at least one select input coupled to an output of the shift register, and a plurality of data inputs, each data input coupled to a node presenting one of:
the cubic compensation value;
the complement of the cubic compensation value, and
the fixed constant value.

22. A compensation circuit for a sigma-delta modulator comprising:
a shift register for storing at least one most-recent output bit from a sigma-delta modulator, the shift register having at least one output;
a first storage location for storing a quadratic compensation value;
a second storage location for storing a cubic compensation value; and
a logic unit having an output providing, in response to the at least one output of the shift register, one of:
the quadratic compensation value;
the cubic compensation value; and
a linear combination of the quadratic compensation value and the cubic compensation value.

23. A method for processing an analog signal in a system-on-a-chip that includes a programmable logic circuit block and an A/D circuit block including a sigma-delta modulator, the method comprising:
receiving the analog signal in the A/D circuit block;
compensating the A/D sigma-delta modulator including:
providing a first binary word Q that represents a desired amount of quadratic compensation;
encoding from the output of the A/D sigma-delta modulator a first low-resolution signal having a value and a duty factor that together approximate a quadratic function of the A/D sigma-delta modulator input;
multiplying the first binary word Q by the first low-resolution signal to generate a first resultant number; and
adding the first resultant number to the A/D sigma-delta modulator output;
outputting a compensated digital signal from the A/D circuit block;
receiving the compensated digital signal in the programmable logic circuit block;
processing the compensated digital signal in the programmable logic circuit block.

24. The method of claim 23, wherein the system-on-a-chip further includes a D/A circuit block including a sigma-delta modulator, the method further comprising:
outputting a processed digital signal from the programmable logic circuit block to the D/A circuit block;
compensating the D/A sigma-delta modulator including:
providing a second binary word Q that represents a desired amount of quadratic compensation;
encoding from the output of the D/A sigma-delta modulator a second low-resolution signal having a value and a duty factor that together approximate a quadratic function of the D/A sigma-delta modulator input;
multiplying the second binary word Q by the second low-resolution signal to generate a second resultant number; and
adding the second resultant number to the D/A sigma-delta modulator input;
outputting a compensated analog signal from the D/A circuit block.

25. A system-on-a-chip comprising:
an A/D converter circuit block including an A/D delta-sigma modulator and an A/D compensation circuit for the sigma-delta modulator, the A/D compensation circuit including:
an A/D shift register for storing at least one most-recent output bit from the A/D sigma-delta modulator, the shift register having at least one output;
an A/D storage location for storing an A/D quadratic compensation value; and
an A/D logic unit having an output providing, in response to the at least one output of the A/D shift register, one of:
the A/D quadratic compensation value; and
one of a complement of the A/D quadratic compensation value and a fixed constant value; and
a programmable logic circuit block coupled to the A/D converter circuit block.

26. The system-on-a-chip of claim 25, further comprising:
a D/A converter circuit block coupled to the programmable logic circuit block, the D/A converter circuit block including:
a D/A converter circuit block including a D/A delta-sigma modulator and a D/A compensation circuit for the D/A sigma-delta modulator, the D/A compensation circuit including:
a D/A shift register for storing at least one most-recent output bit from the D/A sigma-delta modulator, the D/A shift register having at least one output;
a D/A storage location for storing a D/A quadratic compensation value;
and
a D/A logic unit having an output providing, in response to the at least one output of the D/A shift register, one of:
the D/A quadratic compensation value; and
one of a complement of the D/A quadratic compensation value and a fixed constant value.

* * * * *